(12) United States Patent
Minamisawa

(10) Patent No.: US 12,124,160 B2
(45) Date of Patent: Oct. 22, 2024

(54) OPTICAL UNIT

(71) Applicant: NIDEC SANKYO CORPORATION, Nagano (JP)

(72) Inventor: Shinji Minamisawa, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 697 days.

(21) Appl. No.: 17/298,026

(22) PCT Filed: Apr. 15, 2019

(86) PCT No.: PCT/JP2019/016102
§ 371 (c)(1),
(2) Date: May 28, 2021

(87) PCT Pub. No.: WO2020/110339
PCT Pub. Date: Jun. 4, 2020

(65) Prior Publication Data
US 2022/0091476 A1 Mar. 24, 2022

(30) Foreign Application Priority Data
Nov. 30, 2018 (JP) .................................. 2018-224949

(51) Int. Cl.
*G03B 5/00* (2021.01)
*H04N 23/51* (2023.01)
(Continued)

(52) U.S. Cl.
CPC .............. *G03B 5/00* (2013.01); *H04N 23/51* (2023.01); *H04N 23/54* (2023.01); *H05K 1/189* (2013.01)

(58) Field of Classification Search
None
See application file for complete search history.

(56) References Cited

U.S. PATENT DOCUMENTS 7,193,653 B2   3/2007 Lee
8,117,627 B2 * 2/2012 Gotoh .................. G11B 17/056
                                                    720/601
(Continued)

FOREIGN PATENT DOCUMENTS

CN    1501666      6/2004
CN   103676404     3/2014
(Continued)

OTHER PUBLICATIONS

"Office Action of China Counterpart Application" with English translation thereof, issued on Jun. 2, 2022, p. 1-p. 14.

(Continued)

*Primary Examiner* — Derek S. Chapel
(74) *Attorney, Agent, or Firm* — JCIPRNET

(57) ABSTRACT

An optical unit is provided and includes: a movable body having an optical module, a fixed body, a support mechanism turnably supporting the movable body with respect to the fixed body, a flexible wiring board whose one end connected with a connection part provided in the movable body and disposed on a side in a first intersecting direction intersecting an optical axis direction with respect to the movable body, and a positioning part disposed on the side in the first intersecting direction and positioning an other end of the flexible wiring board in the optical axis direction. The flexible wiring board is folded to be overlapped with each other when being viewed in the optical axis direction. A position in the optical axis direction of the turning axis is located at a position on an outer side with respect to a range from the connection part to the positioning part.

13 Claims, 10 Drawing Sheets

(51) Int. Cl.
*H04N 23/54* (2023.01)
*H05K 1/18* (2006.01)

(56) References Cited

U.S. PATENT DOCUMENTS

| | | | |
|---|---|---|---|
| 9,332,188 B2 | 5/2016 | Takei et al. | |
| 9,891,444 B2 | 2/2018 | Minamisawa | |
| 10,048,508 B2 | 8/2018 | Sue et al. | |
| 10,185,156 B2 | 1/2019 | Minamisawa et al. | |
| 10,197,887 B2 | 2/2019 | Enta | |
| 10,598,953 B2 | 3/2020 | Minamisawa et al. | |
| 10,983,362 B2 | 4/2021 | Minamisawa | |
| 2004/0198433 A1 | 10/2004 | Lee | |
| 2006/0044442 A1 | 3/2006 | Suh et al. | |
| 2007/0077805 A1* | 4/2007 | Nomura | H04N 23/68 348/E5.046 |
| 2008/0074744 A1* | 3/2008 | Osaka | H04N 23/687 359/554 |
| 2009/0126976 A1* | 5/2009 | Iida | H05K 1/028 29/829 |
| 2012/0050866 A1* | 3/2012 | Umezu | G02B 27/646 359/557 |
| 2012/0224840 A1 | 9/2012 | Minamisawa et al. | |
| 2014/0139693 A1 | 5/2014 | Takei et al. | |
| 2016/0142599 A1* | 5/2016 | Shimizu | G03B 5/00 348/374 |
| 2016/0231641 A1* | 8/2016 | Minamisawa | G03B 5/06 |
| 2017/0353662 A1* | 12/2017 | Enta | G02B 27/646 |
| 2018/0048221 A1 | 2/2018 | Takeda et al. | |
| 2018/0063395 A1* | 3/2018 | Vehkaperä | H04N 23/57 |
| 2018/0284477 A1* | 10/2018 | Minamisawa | G03B 17/02 |
| 2019/0346748 A1* | 11/2019 | Kameyama | G03B 17/561 |
| 2022/0091477 A1* | 3/2022 | Minamisawa | H05K 1/028 |

FOREIGN PATENT DOCUMENTS

| | | |
|---|---|---|
| CN | 103688217 | 3/2014 |
| CN | 104919366 | 9/2015 |
| CN | 106324941 | 1/2017 |
| CN | 107092066 | 8/2017 |
| CN | 107251385 | 10/2017 |
| CN | 107615160 | 1/2018 |
| CN | 108073012 | 5/2018 |
| CN | 108693677 | 10/2018 |
| JP | 2002131806 | 5/2002 |
| JP | 2011069915 | 4/2011 |
| JP | 2013025117 | 2/2013 |
| JP | 2016138928 | 8/2016 |
| JP | 2018169499 | 11/2018 |

OTHER PUBLICATIONS

"International Search Report (Form PCT/ISA/210) of PCT/JP2019/016102," mailed on Jul. 16, 2019, with English translation thereof, pp. 1-4.

Office Action of China Counterpart Application, with English translation thereof, issued on Dec. 31, 2021, pp. 1-21.

* cited by examiner (a)

(b)

OPTICAL UNIT

CROSS-REFERENCE TO RELATED APPLICATION

This application is a 371 application of the international PCT application serial no. PCT/JP2019/016102, filed on Apr. 15, 2019, which claims the priority benefits of Japan application no. 2018-224949 filed on Nov. 30, 2018. The entirety of each of the above-mentioned patent applications is hereby incorporated by reference herein and made a part of this specification.

TECHNICAL FIELD

The present invention relates to an optical unit.

BACKGROUND ART

Conventionally, various optical units have been used which include a movable body having an optical module, a fixed body which displaceably holds the movable body, and a flexible wiring board connected with the movable body. For example, Patent Literature 1 discloses an optical unit which includes a movable module holding an optical element, a fixed body displaceably holding the movable module, and a flexible wiring board connected with the movable module.

CITATION LIST

Patent Literature

[Patent Literature 1] Japanese Patent Laid-Open No. 2011-69915

SUMMARY OF THE INVENTION

Problems to be Solved by the Invention

However, in a conventional optical unit including a movable body, a fixed body and a flexible wiring board as described above, the flexible wiring board is displaced with displacement of the movable body and thus, a load is applied to the flexible wiring board with the displacement of the flexible wiring board and, as a result, the flexible wiring board may be damaged. In addition, in some optical devices using the optical unit, the sizes are required to be reduced and thus, a size of the optical unit is required to be reduced. In view of the problem described above, an objective of the present invention is to reduce a size of the optical unit while reducing a load which is applied to a flexible wiring board.

Means to Solve the Problems

An optical unit in accordance with the present invention includes: a movable body having an optical module, a fixed body, a support mechanism which turnably supports the movable body with respect to the fixed body with one or a plurality of directions intersecting an optical axis direction as a direction of a turning axis, a flexible wiring board whose one end is connected with a connection part provided in the movable body and which is disposed on a side in a first intersecting direction intersecting the optical axis direction with respect to the movable body, and a positioning part which is disposed on the side in the first intersecting direction with respect to the movable body and positions the other end of the flexible wiring board in the optical axis direction. The flexible wiring board is folded so as to be overlapped with each other in a state that the flexible wiring board is viewed in the optical axis direction, and a position in the optical axis direction of the turning axis is located at a position on an outer side with respect to a range from the connection part to the positioning part.

According to this aspect, since the flexible wiring board is folded so as to be overlapped with each other in a state that the flexible wiring board is viewed in the optical axis direction, a length of the flexible wiring board can be increased and, since responsiveness to displacement of the flexible wiring board is improved, a load applied to the flexible wiring board can be reduced. In addition, since a position in the optical axis direction of the turning axis is located at a position on an outer side with respect to a range from the connection part to the positioning part, a length in the optical axis direction of a wiring region of the flexible wiring board (length in the optical axis direction from the connection part to the positioning part) can be reduced, in other words, a volume of the wiring region of the flexible wiring board can be reduced. Therefore, a size of the optical unit can be reduced while reducing a load applied to the flexible wiring board.

In the optical unit of the present invention, it is preferable that a folding direction of the flexible wiring board in an extended direction from the one end toward the other end in a state that the flexible wiring board is viewed in the first intersecting direction includes at least a folding direction to a side of the turning axis in the optical axis direction. When the flexible wiring board is folded to the side of the turning axis, a load applied to the flexible wiring board can be effectively reduced.

In the optical unit of the present invention, it is preferable that a number of folding times of the flexible wiring board is a plurality of times, and the folding direction of the flexible wiring board in the extended direction in a state that the flexible wiring board is viewed in the first intersecting direction includes both the side of the turning axis in the optical axis direction and an opposite side to the side of the turning axis in the optical axis direction. When the folding direction of the flexible wiring board includes both the side of the turning axis in the optical axis direction and an opposite side to the side of the turning axis in the optical axis direction, a length in the optical axis direction in a wiring region of the flexible wiring board can be effectively reduced.

In the optical unit of the present invention, it is preferable that the number of folding times of the flexible wiring board is set so that a number of folding times to the side of the turning axis in the optical axis direction and a number of folding times to the opposite side to the side of the turning axis in the optical axis direction are the same as each other. When the number of folding times to the turning axis side and the number of folding times to the opposite side to the turning axis side are set to be the same as each other, a length in the optical axis direction in the wiring region of the flexible wiring board can be especially effectively reduced.

In the optical unit of the present invention, it is preferable that the flexible wiring board is symmetrically folded with a center part in the first intersecting direction of respective folded portions of the flexible wiring board as a reference in a state that the flexible wiring board is viewed in a direction intersecting both the optical axis direction and the first intersecting direction. When the flexible wiring board is symmetrically folded in the first intersecting direction, deflection of folding of the flexible wiring board in the first intersecting direction can be reduced.

In the optical unit of the present invention, it is preferable that the number of folding times of the flexible wiring board is an even number of times. When the number of folding times of the flexible wiring board is set to an even number of times, in an extended direction from one end of the flexible wiring board to the other end, the flexible wiring board is directed toward a side approaching the movable body in the first intersecting direction in an odd-numbered folded portion, and the flexible wiring board is directed toward a side sepatated from the movable body in the first intersecting direction in an even-number folded portion. In other words, when the number of folding times of the flexible wiring board is set to an even number of times, the flexible wiring board can be easily disposed at a position separated from the movable body, and the flexible wiring board can be easily disposed toward a direction separated from the movable body and thus, contacting of the flexible wiring board with the movable body can be restrained. Further, a degree of freedom of wiring can be enhanced.

In the optical unit of the present invention, it is preferable that a position of the positioning part in the optical axis direction is different from a position of the connection part in the optical axis direction. According to this structure, a length of the flexible wiring board can be easily increased.

In the optical unit of the present invention, it is preferable that the flexible wiring board is provided with a branch region in which the flexible wiring board is branched in an extended direction going from the one end toward the other end. According to this structure, a load applied to the flexible wiring board can be effectively reduced.

In the optical unit of the present invention, it is preferable that the branch region viewed in the extended direction is formed so that the flexible wiring board is symmetrical. According to this structure, a load applied to the flexible wiring board can be especially effectively reduced.

In the optical unit of the present invention, it is preferable that the positioning part is integrally formed with the fixed body. When the positioning part is integrally formed with the fixed body, the flexible wiring board can be positioned with a high degree of accuracy.

In the optical unit of the present invention, it is preferable that the positioning part allows movement in the first intersecting direction of the flexible wiring board. When movement in the first intersecting direction of the flexible wiring board is allowed, in a case that a load is applied to the flexible wiring board in the first intersecting direction, the flexible wiring board is capable of moving in the first intersecting direction and thereby, the load can be reduced and the load applied to the flexible wiring board can be effectively reduced.

In the optical unit of the present invention, it is preferable that the positioning part is provided with a cover which covers at least a part of the flexible wiring board. According to this structure, the flexible wiring board can be restrained from contacting with other structure members and being damaged.

In the optical unit of the present invention, it is preferable that a folded portion of the flexible wiring board includes a folding hold part which holds the folded portion. For example, the flexible wiring board is folded by 180° in a folded portion by a folding hold part so that the folded flexible wiring boards are not contacted with each other. According to this structure, a wiring region of the flexible wiring board can be effectively reduced, and damage of the flexible wiring board due to contact of the flexible wiring boards can be restrained.

In the optical unit of the present invention, it is preferable that the optical unit includes a turning drive mechanism structured to turn the movable body with respect to the fixed body, and the turning drive mechanism is disposed at a position other than the side in the first intersecting direction with respect to the movable body. According to this structure, the turning drive mechanism is disposed on a side where the flexible wiring board is not formed and thus, a size of the optical unit is not required to increase for restraining the turning drive mechanism from contacting with the flexible wiring board and, as a result, a size of the optical unit can be reduced.

In the optical unit of the present invention, it is preferable that the optical module includes an imaging element, and the imaging element is disposed on the side in the first intersecting direction with the turning axis as a reference. According to this arrangement, a length of the flexible wiring board can be reduced in an inside of the fixed body and a size of the fixed body can be reduced and, as a result, a size of the optical unit can be reduced.

Effects of the Invention

According to the optical unit in the present invention, a size of the optical unit can be reduced while reducing a load which is applied to the flexible wiring board.

DESCRIPTION OF EMBODIMENTS

Preferred embodiments of the present invention will be described below with reference to the accompanying drawings. The same reference signs are used in the same structures in the respective embodiments and the same structures are described only in the first embodiment and the descriptions of the same structures are omitted in the following embodiments.

Figure 4:
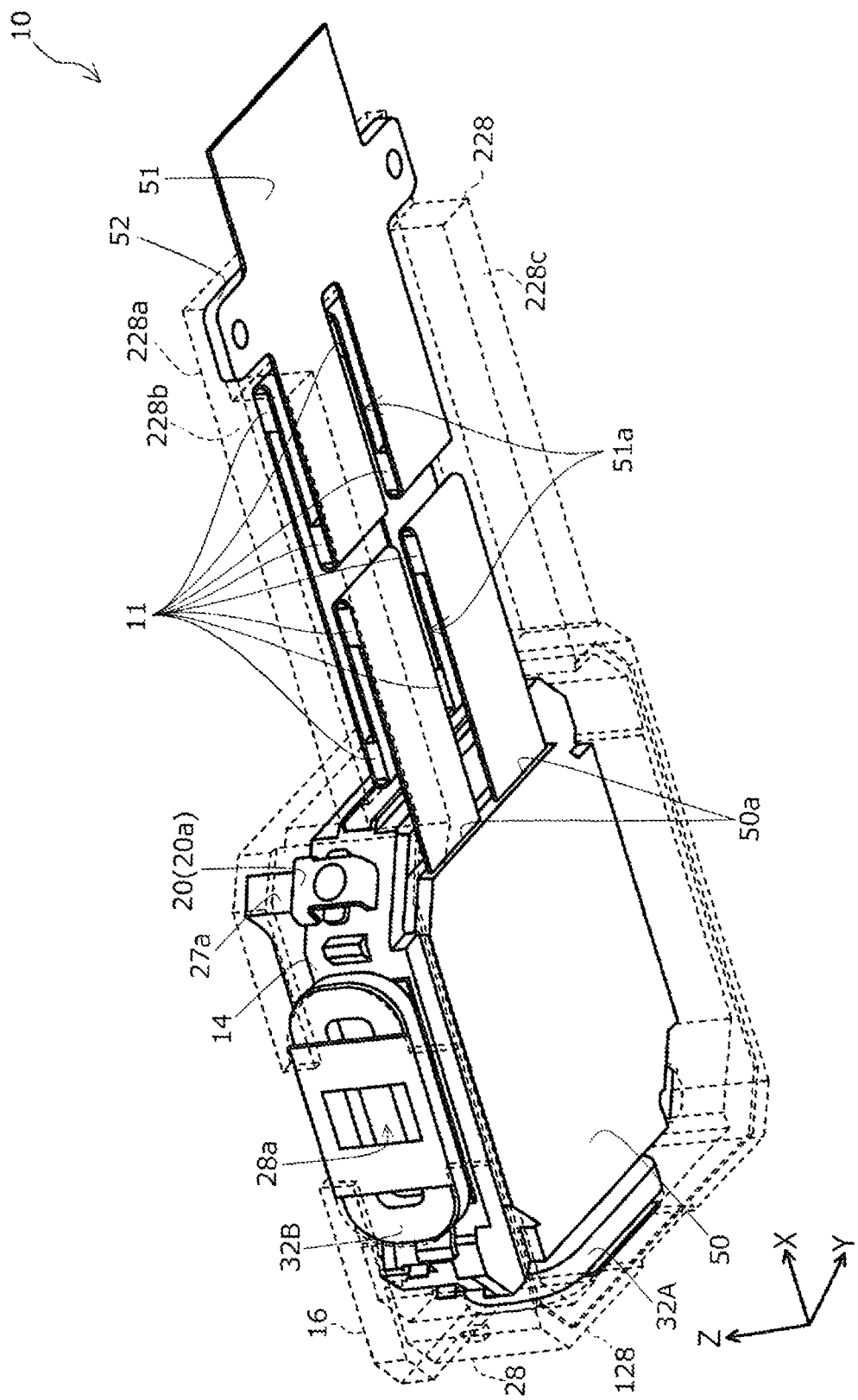
FIG. 4 is a perspective view showing the optical unit in accordance with the first embodiment of the present invention in which a fixed body of the optical unit is indicated in a transparent manner.
Figure 5:
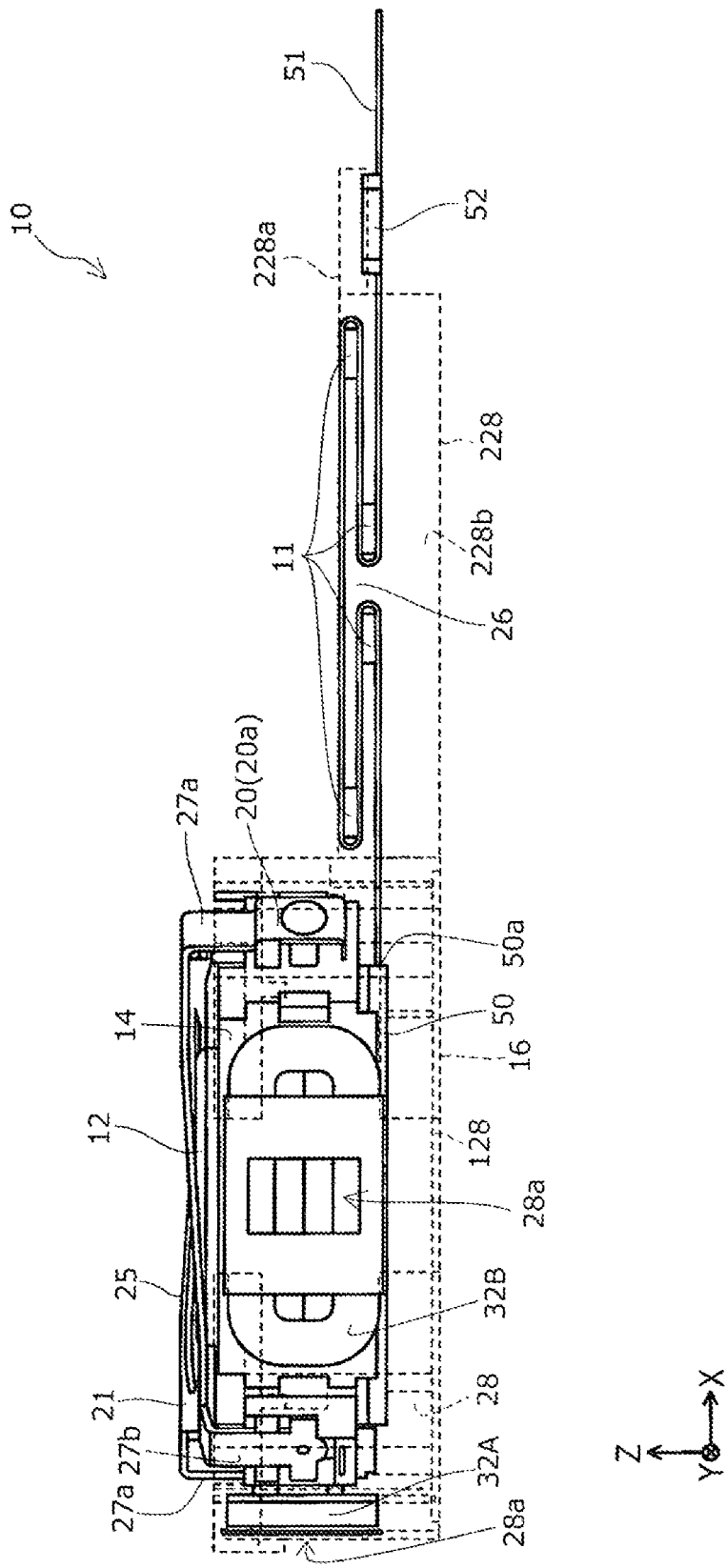
FIG. 5 is a side view showing the optical unit in accordance with the first embodiment of the present invention in which the fixed body of the optical unit is indicated in a transparent manner.
Figure 6:
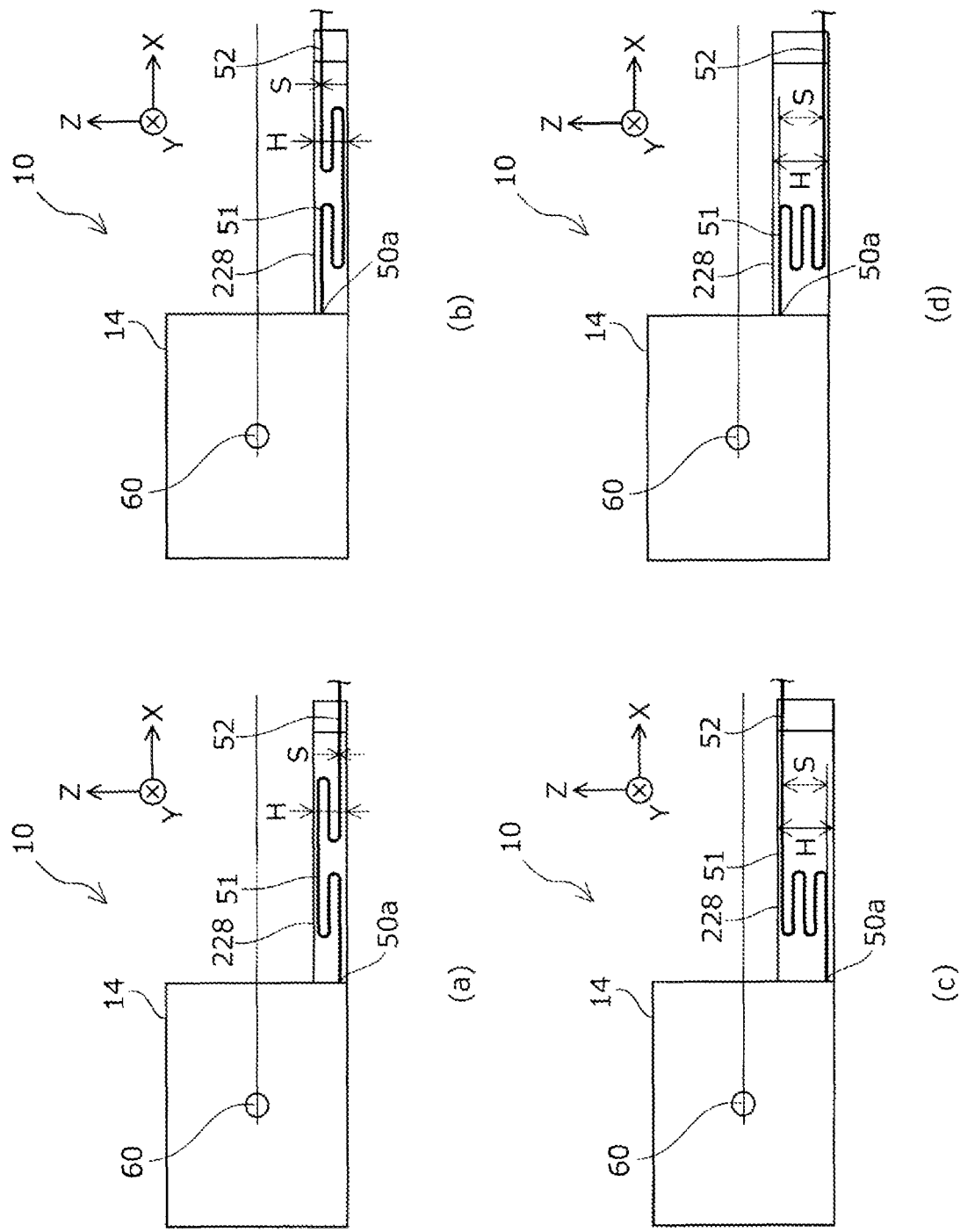
In FIG. 6, (a) through (d) are schematic views showing optical units in accordance with the first embodiment through a fourth embodiment of the present invention.

[First Embodiment] (FIG. 1 Through FIG. 5, and (a) of FIG. 6)

Figure 1:
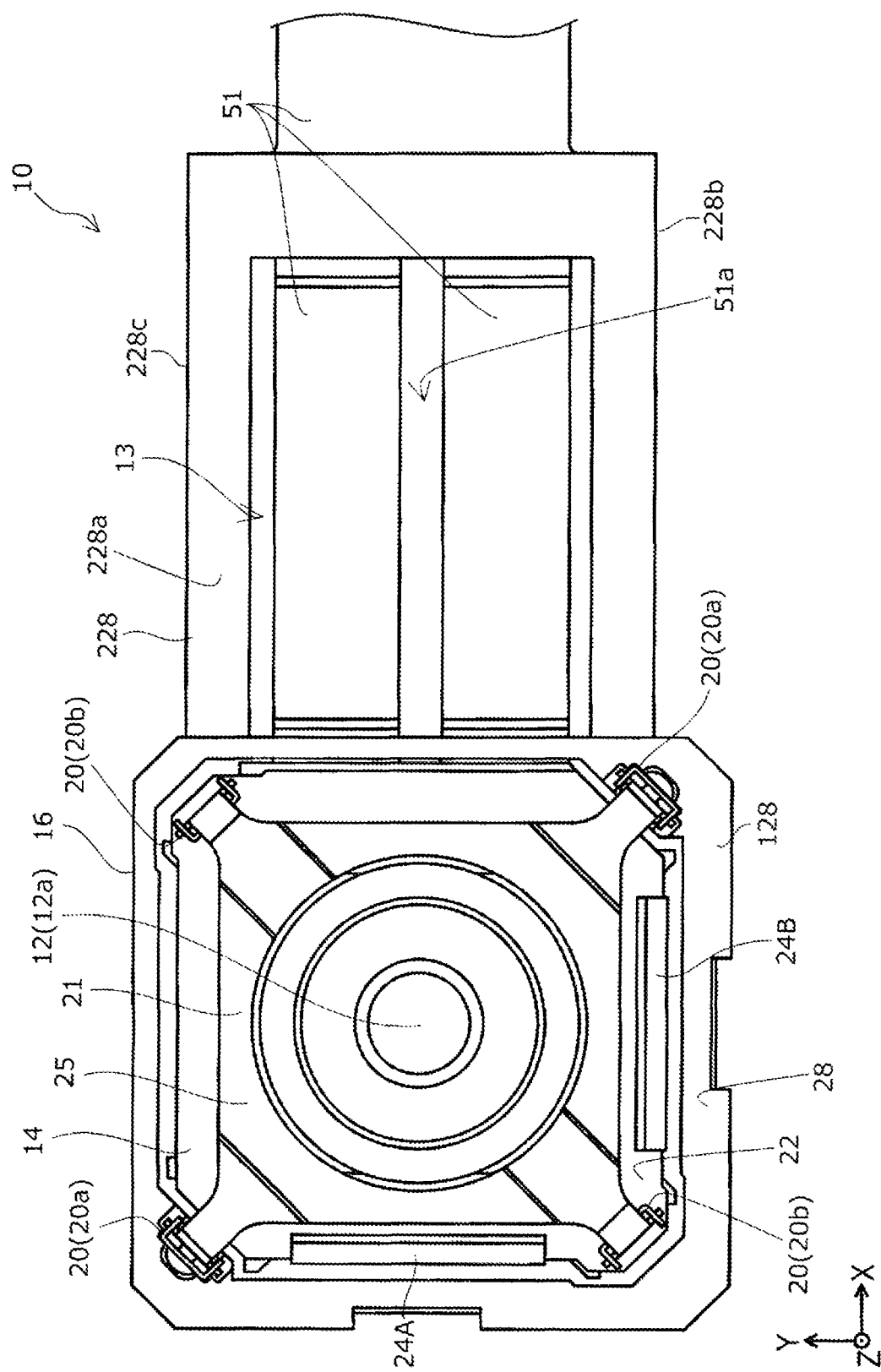
FIG. 1 is a plan view showing an optical unit in accordance with a first embodiment of the present invention.
Figure 2:
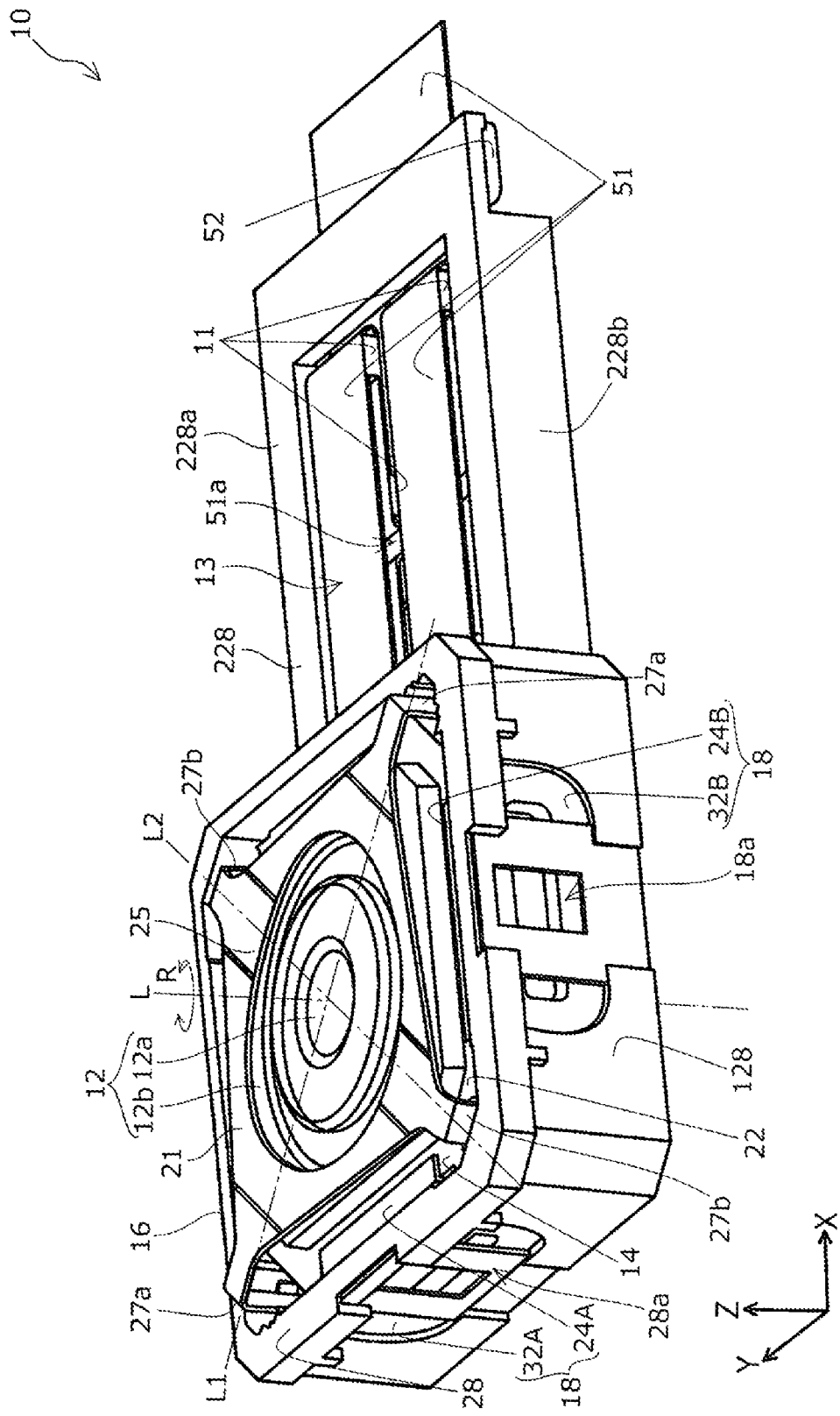
FIG. 2 is a perspective view showing the optical unit in accordance with the first embodiment of the present invention.
Figure 3:
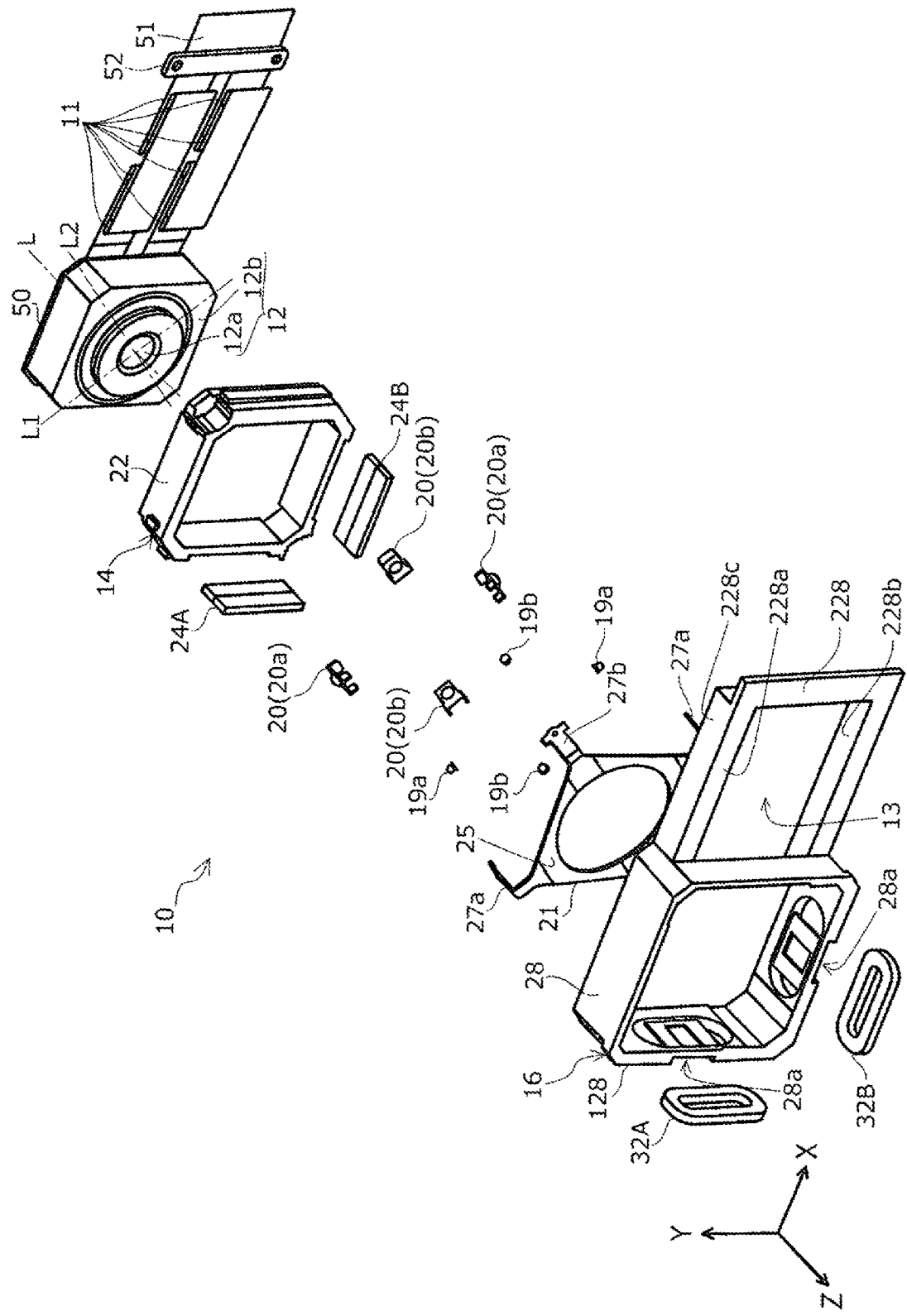
FIG. 3 is an exploded perspective view showing the optical unit in accordance with the first embodiment of the present invention.

First, an optical unit in accordance with a first embodiment of the present invention will be described below with reference to FIG. 1 through FIG. 5, and (a) of FIG. 6. In FIG. 2 and FIG. 3, the alternate long and short dash line with the reference sign "L" indicates an optical axis, the alternate long and short dash line with the reference sign "L1" indicates a first axial line intersecting the optical axis, and the alternate long and short dash line with the reference sign "L2" indicates a second axial line "L2" intersecting the optical axis "L" and the first axial line "L1". Further, an "R"-direction indicates a direction around the optical axis. In the respective drawings, the "Z"-axis direction is an optical axis direction, the "X"-axis direction is a direction intersecting the optical axis, in other words, an axial direction of yawing, and the "Y"-axis direction is a direction intersecting the optical axis, in other words, an axial direction of pitching.

<Entire Schematic Structure of Optical Unit>

In FIG. 1 through FIG. 5, a structure of an optical unit 10 in accordance with an embodiment of the present invention will be described below. The optical unit 10 includes a movable body 14 having an optical module 12, and a fixed body 16 which holds the movable body 14 in displaceable states in a direction (pitching direction) whose turning axis is the "Y"-axis direction and in a direction (yawing direction) whose turning axis is the "X"-axis direction. Further, the optical unit 10 includes a turning drive mechanism 18 structured to drive the movable body 14 in the pitching direction and the yawing direction, and a support mechanism 20 which turnably supports the movable body 14 in the pitching direction and the yawing direction with respect to the fixed body 16. In addition, the optical unit 10 includes a gimbal mechanism 21 in which first support parts 19a for turnably supporting the movable body 14 around the first axial line "L1" are provided in first support part extended parts 27a, and second support parts 19b turnably supported around the second axial line "L2" by a member on the fixed body 16 side are provided in second support part extended parts 27b (see FIG. 3).

<Regarding Optical Module>

In this embodiment, the optical module 12 is formed in a substantially rectangular case shape and is used as a thin camera or the like which is, for example, mounted on a cellular phone with a camera or a tablet type PC. The optical module 12 includes a lens 12a on an object side and is incorporated with an optical device for imaging and the like in an inside of a rectangular case-shaped housing 12b. The optical module 12 in this embodiment is, as an example, incorporated with an actuator which is capable of correcting a shake of pitching (shake in a turning direction with the "Y"-axis direction as a turning axis) occurred in the optical module 12 and a shake of yawing (shake in a turning direction with the "X"-axis direction as a turning axis) and is structured so as to be capable of correcting a shake of pitching and a shake of yawing.

In this embodiment, the optical module 12 is structured so as to be capable of correcting a shake of pitching and a shake of yawing. However, the present invention is not limited to this structure. For example, the optical module 12 may be structured so as to be capable of correcting only one of a shake of pitching and a shake of yawing.

<Regarding Movable Body>

In FIG. 1 through FIG. 5, the movable body 14 includes the optical module 12, a holder frame 22, and magnets 24A and 24B. The holder frame 22 is structured as a rectangular frame-shaped member which is provided so as to surround four faces except a front face (face on an object side) where the lens 12a of the optical module 12 is provided and a rear face on an opposite side. The holder frame 22 in this embodiment is, as an example, structured so that the optical module 12 is detachably attached. The magnets 24A and 24B for pitching and yawing corrections are attached to the holder frame 22 by utilizing outer faces of the two faces which face the fixed body 16.

<Regarding Fixed Body>

In FIG. 1 through FIG. 5, the fixed body 16 includes a fixed frame 28 and coils 32A and 32B. In this embodiment, the fixed frame 28 is structured of a rectangular frame-shaped member 128, which is provided so as to surround at least three faces of the holder frame 22 of the movable body 14 in a direction around the optical axis ("R"-direction), and an extended part 228 having a wall part 228a, a wall part 228b and a wall part 228c which are extended to an outer side along the "X"-axis direction. The wall part 228a is a wall part which covers a part on the front face side (face on an object side) and is formed with a hole part 13. Further, the wall part 228b and the wall part 228c are wall parts which cover in the "Y"-axis direction. In this embodiment, a region of the member 128 surrounded from three directions by the wall part 228a, the wall part 228b and the wall part 228c on the extended part 228 side is formed to be a space (a wall part is not provided).

The fixed body 16 in this embodiment is structured so that a flexible wiring board 51 described below is capable of being covered from three directions by the wall part 228a, the wall part 228b and the wall part 228c, and the fixed body 16 is provided with a positioning part 52 (see FIG. 4) which positions the flexible wiring board 51 in the "Z"-axis direction. When a cover which covers at least a part of the flexible wiring board 51 is provided as shown in the optical unit 10 in this embodiment, the flexible wiring board 51 can be restrained from contacting with other structure members and being damaged. The extended part 228 in this embodiment is not provided with a wall part on a side facing the wall part 228a. This is because that workability is enhanced when the flexible wiring board 51 is to be disposed in the extended part 228. However, the present invention is not limited to such a structure. For example, a wall part may be provided on a side facing the wall part 228a, and a wall part may be attached after the flexible wiring board 51 has been disposed in the extended part 228. Further, it may be structured that the hole part 13 is not provided in the wall part 228a.

As shown in FIG. 2 and the like, the coils 32A and 32B are respectively attached to coil attaching parts 28a. In this embodiment, the coil 32A and the coil 32B are structured of winding coils as an example. However, the coil may be structured of a pattern substrate (coil substrate) in which a coil is incorporated in wiring of a substrate as a pattern.

In this embodiment, in a state that the movable body 14 has been disposed in the fixed body 16, the magnet 24A and the coil 32A and the magnet 24B and the coil 32B are respectively set in a facing state. Further, in this embodiment, a pair of the magnet 24A and the coil 32A and a pair of the magnet 24B and the coil 32B structure the turning drive mechanism 18. Corrections of pitching and yawing of the movable body 14 are performed by the turning drive mechanism 18.

Corrections of pitching and yawing will be performed as follows. When a shake in both or one of directions of a pitching direction and a yawing direction is occurred in the optical unit 10, the shake is detected by a magnetic sensor (Hall element) not shown and the turning drive mechanism 18 is driven based on the result. Alternatively, a shake of the optical unit 10 may be detected by using a shake detection sensor (gyroscope) or the like. The turning drive mechanism 18 is operated so as to correct the shake based on a detected result of the shake. In other words, an electric current is supplied to the respective coils 32A and 32B so that the movable body 14 is moved in a direction for canceling the shake of the optical unit 10 and, as a result, the shake is corrected.

As described above, the optical unit 10 in this embodiment includes the turning drive mechanism 18 which is structured to turn the movable body 14 with respect to the fixed body 16 with the axial direction of pitching and the axial direction of yawing as turning axes. In this embodiment, it is preferable that the turning drive mechanism 18 is disposed at a position other than a side in the "X"-axis direction where the flexible wiring board 51 is disposed (other than a first intersecting direction side intersecting the optical axis direction) with respect to the movable body 14. According to this structure, the turning drive mechanism 18 is disposed on a side where the flexible wiring board 51 is not formed and thus, a size of the optical unit 10 is not required to increase for restraining the turning drive mechanism 18 from contacting with the flexible wiring board 51 and, as a result, a size of the optical unit 10 can be reduced. The word "turning" in the present specification is not required to turn for 360° and includes a swing in the turning direction.

In this embodiment, a drive source for correcting a shake is not limited to a voice coil motor which is structured of the respective pairs of the coils 32A and 32B and the magnets 24A and 24B like the turning drive mechanism 18. A stepping motor, a device utilizing a piezo element or the like may be used as another drive source.

<Regarding Support Mechanism>

The support mechanism 20 includes a metal plate 20a, which forms a protruding curved face in a hemispherical shape toward an outer side of the optical unit 10, and a metal plate 20b which forms a protruding curved face in a hemispherical shape toward an inner side of the optical unit 10. The metal plate 20a is disposed at two positions facing each other of four corners of the rectangular frame-shaped member 128 of the fixed body 16, and the metal plate 20b is disposed at two positions facing each other of four corners of the movable body 14 in a rectangular frame shape. In this embodiment, the rectangular frame-shaped member 128 and the movable body 14 in a rectangular frame shape are disposed so that the positions of their four corners are aligned with each other, and the metal plates 20a and the metal plates 20b are disposed at four corners one by one.

In the support mechanism 20 in this embodiment, the first support part 19a provided in the first support part extended part 27a of the gimbal mechanism 21 is disposed on an inner side of the protruding curved face in a hemispherical shape of the metal plate 20a which faces an outer side. The support mechanism 20 supports the gimbal mechanism 21 with respect to the fixed body 16 by such a structure. Further, the second support part 19b provided in the second support part extended part 27b of the gimbal mechanism 21 is disposed on an inner side of the protruding curved face in a hemispherical shape of the metal plate 20b which faces an inner side. The support mechanism 20 supports the gimbal mechanism 21 with respect to the movable body 14 by such a structure. In other words, the support mechanism 20 in this embodiment is structured so that the movable body 14 can be turnably supported with respect to the fixed body 16 with one or a plurality of directions (at least one of the "X"-axis direction and the "Y"-axis direction) intersecting the optical axis direction ("Z"-axis direction) as turning axis directions. The support mechanism 20 in this embodiment is structured so that the movable body 14 is allowed to turn with the axial direction of pitching as a turning axis and that the movable body 14 is allowed to turn with the axial direction of yawing as a turning axis. However, the support mechanism 20 may be structured so that the movable body 14 is also allowed to turn in a rolling direction.

<Gimbal Mechanism>

The gimbal mechanism 21 is a mechanism which is formed by bending a flat plate member made of metal and is provided with a spring property. Specifically, the gimbal mechanism 21 is, as an example, structured so as to have a gimbal frame part 25 provided on an object side, and the first support part extended parts 27a and the second support part extended parts 27b which are formed by bending by 90° in the optical axis direction from four corner parts of the gimbal frame part 25. In this case, the first support part extended part 27a and the second support part extended part 27b are not required to be entirely formed in a plate shape, but parts of the first support part extended part 27a and the second support part extended part 27b may be formed in a plate shape to have a spring property. Further, one of the first support part extended part 27a and the second support part extended part 27b may be made in another shape (for example, rod shape) other than a plate shape.

<Imaging Element>

As shown in FIG. 3 through FIG. 5, the optical module 12 includes an imaging element 50 on an opposite side to an object side. As shown in FIG. 4 and FIG. 5, a flexible wiring board 51 is connected with a connection part 50a of the imaging element 50. In this embodiment, the connection part 50a of the imaging element 50 is formed on the extended part 228 side, and the flexible wiring board 51 is covered by the wall part 228a, the wall part 228b and the wall part 228c of the extended part 228 in directions other than an opposite side to an object side. In this case, the connection part 50a of the flexible wiring board 51 is not required to be provided in the imaging element 50 and may be provided in a portion of the movable body 14 other than the imaging element 50.

<Flexible Wiring Board>

As shown in FIG. 4, one end of the flexible wiring board 51 is connected with the connection part 50a provided in the movable body 14. Further, as described above, the flexible wiring board 51 is disposed on the first intersecting direction side with respect to the movable body 14. Further, the other end of the flexible wiring board 51 is fixed by the positioning part 52 which is disposed on the first intersecting direction side with respect to the movable body 14.

The other end of the flexible wiring board 51 in this embodiment is fixed with respect to the wall part 228a by the positioning part 52. However, it is sufficient that the flexible wiring board 51 is determined at a position in the optical axis direction ("Z"-axis direction). For example, it may be structured that the positioning part 52 is attached so as to form a space with respect to the wall part 228a and a position in the "Z"-axis direction of the other end of flexible wiring board 51 is determined by passing the other end through the space.

According to this structure, movement in the "X"-axis direction (movement in the first intersecting direction) of the flexible wiring board 51 can be allowed and thus, in a case that a load is applied to the flexible wiring board 51 in the "X"-axis direction, the flexible wiring board 51 is capable of moving in the "X"-axis direction and thereby the load can be reduced. In other words, a load applied to the flexible wiring board 51 can be effectively reduced.

As shown in FIG. 5, (a) of FIG. 6 and the like, the flexible wiring board 51 in this embodiment is folded four times in total so as to be overlapped with each other when viewed in the "Z"-axis direction. In this case, as shown in (a) of FIG. 6, in the optical unit 10 in this embodiment, a position in the "Z"-axis direction of a turning axis 60 of the movable body 14 with respect to the fixed body 16 in the axial direction of pitching along the "Y"-axis direction is located on an outer side with respect to a range "S" from the connection part 50a to the positioning part 52. Accurately, the expression of that "the position in the "Z"-axis direction of the positioning part 52" means a position in the "Z"-axis direction of the flexible wiring board 51 which is positioned by the positioning part 52.

The optical unit 10 in this embodiment is structured so that a length of the flexible wiring board 51 can be increased by folding the flexible wiring board 51 so as to be overlapped with each other when viewed in the optical axis direction, and that a load applied to the flexible wiring board 51 can be reduced by improving responsiveness to displacement of the flexible wiring board 51. In addition, the optical unit 10 is structured so that, since the position in the optical axis direction of the turning axis 60 is set to be an outer side with respect to the range "S" from the connection part 50a to the positioning part 52, a length "H" in the optical axis direction of a wiring region (extended part 228) of the flexible wiring board 51 (a range "S" corresponding to a length in the optical axis direction from the connection part 50a to the positioning part 52) can be reduced and, in other words, a volume of the wiring region of the flexible wiring board 51 can be reduced. Since the optical unit 10 in this embodiment is structured as described above, a size of the optical unit 10 is reduced while reducing a load which is applied to the flexible wiring board 51. In this case, the expression of that "the position in the optical axis direction of the turning axis 60 is set to be an outer side with respect to a range "S" from the connection part 50a to the positioning part 52" means to exclude cases that the position in the optical axis direction of the turning axis 60 is located at the same position as the position of the connection part 50a and the position of the positioning part 52. In the optical unit 10 in this embodiment, the position in the optical axis direction of the positioning part 52 is located at the same position as the position of the connection part 50a. Further, the expression of that the "position in the optical axis direction of the turning axis 60" means a turning center (swing center) of the turning axis 60. For example, the "position in the optical axis direction of the turning axis 60" corresponds to a "position of an intersecting point with the optical axis in the optical axis direction of the turning axis 60".

As shown in FIG. 5, (a) of FIG. 6 and the like, the flexible wiring board 51 in this embodiment is folded twice of four folding times toward an object side. In other words, a folding direction of the flexible wiring board 51 in an extended direction where the flexible wiring board 51 is directed from one end toward the other end when viewed in the first intersecting direction includes at least a folding direction toward the turning axis 60 side (an object side) in the optical axis direction. When the flexible wiring board 51 is folded to the turning axis 60 side like the flexible wiring board 51 in this embodiment, the flexible wiring board 51 approaches the turning axis 60 and thus, a moving amount of the flexible wiring board 51 with respect to a turning amount (turning angle) of the movable body 14 can be reduced. Therefore, a load applied to the flexible wiring board 51 can be effectively reduced.

As shown in FIG. 5, (a) of FIG. 6 and the like, the flexible wiring board 51 in this embodiment is folded twice toward an object side and twice toward an opposite side to the object side. In other words, the number of folding times of the flexible wiring board 51 in this embodiment is a plurality of times and, when viewed in the first intersecting direction, a folding direction of the flexible wiring board 51 in an extended direction includes both of a direction toward the turning axis side (an object side) in the optical axis direction and a direction toward an opposite side to the turning axis side (opposite side to an object side) in the optical axis direction. As described above, when a folding direction of the flexible wiring board 51 includes both of a direction on the turning axis side in the optical axis direction and a direction on the opposite side to the turning axis side in the optical axis direction, a length "H" in the optical axis direction in a wiring region of the flexible wiring board 51 can be effectively reduced.

Further, as described above, the number of folding times of the flexible wiring board 51 in this embodiment is set so that the number of folding times to the turning axis side in the optical axis direction and the number of folding times to the opposite side to the turning axis side in the optical axis direction are the same as each other and thus, the length in the optical axis direction in the wiring region of the flexible wiring board 51 can be especially effectively reduced.

Further, as described above, the number of folding times of the flexible wiring board 51 in this embodiment is an even number of times. When the number of folding times of the flexible wiring board 51 is set to an even number of times, in an extended direction going from one end of the flexible wiring board 51 to the other end, the flexible wiring board 51 is directed toward a side approaching the movable body 14 in the first intersecting direction in an odd-numbered folded portion, and the flexible wiring board 51 is directed toward a side separated from the movable body 14 in the first intersecting direction in an even-numbered folded portion. In other words, when the number of folding times of the flexible wiring board 51 is set to an even number of times, the flexible wiring board 51 can be easily disposed at a position separated from the movable body 14, and the flexible wiring board 51 can be easily disposed toward a direction separated from the movable body 14 and thus, contacting of the flexible wiring board 51 with the movable body 14 can be restrained. Further, a degree of freedom of wiring can be also enhanced.

Further, as shown in FIG. 5, when viewed in a direction intersecting the optical axis direction and the first intersecting direction (in other words, in the "Y"-axis direction), the flexible wiring board 51 in this embodiment is symmetrically folded with a center part 26 in the first intersecting direction of respective folded portions of the flexible wiring board 51 as a reference. Therefore, deflection of bending of the flexible wiring board 51 in the first intersecting direction is reduced. In this case, a meaning of the word "symmetrically" includes strictly symmetrical and, in addition, almost symmetrical.

Further, as shown in FIG. 4 and the like, the flexible wiring board 51 in this embodiment is branched in an extended direction going from one end toward the other end.

As described above, it is preferable that the flexible wiring board 51 is provided with a branch region 51a (see FIG. 4). According to this structure, a load applied to the flexible wiring board 51 can be effectively reduced. In this case, a size of the branch region 51a is not especially limited, and the flexible wiring board 51 may be branched in all region from one end to the other end like the flexible wiring board 51 in this embodiment and, alternatively, may be branched only in some region. In addition, a plurality of branch regions 51a may be provided in the flexible wiring board 51.

It is further preferable that the branch region 51a is structured so that the flexible wiring board 51 is symmetrical when viewed in an extended direction like the flexible wiring board 51 in this embodiment. According to this structure, a load applied to the flexible wiring board 51 can be especially effectively reduced. However, a shape of the branch region 51a is not especially limited and the flexible wiring board 51 may be structured to be branched into three or more portions other than two.

In this embodiment, as described above, the positioning part 52 is a plate-shaped member which is attached to the wall part 228a. In other words, the positioning part 52 is integrally formed with the fixed body 16 by being attached and fixed to the wall part 228a. When the positioning part 52 is integrally formed with the fixed body 16, the flexible wiring board 51 can be positioned with a high degree of accuracy. In this case, the expression of "integrally formed with the fixed body 16" is not limited to "integrally molded", and the expression includes a case that the positioning part 52 is attached and fixed to the fixed body 16 as described in this embodiment.

As shown in FIG. 4, FIG. 5 and the like, in the optical unit 10 in this embodiment, a folding hold part which holds a folded portion is provided in the folded portion of the flexible wiring board 51. The flexible wiring board 51 is bent by 180° through the folding hold part in the folded portion so that the folded flexible wiring boards 51 are not contacted with each other. When the folding hold part 11 is provided as described above, a wiring region of the flexible wiring board 51 can be effectively reduced, and damage of the flexible wiring board 51 due to contact of the flexible wiring boards 51 can be restrained.

[Second Embodiment] ((b) of FIG. 6)

(b) of FIG. 6 is a schematic view showing an optical unit 10 in a second embodiment and is a view corresponding to (a) of FIG. 6 in the optical unit 10 of the first embodiment. Structure members common to the first embodiment are indicated with the same reference signs and their detailed descriptions are omitted. An optical unit 10 in this embodiment is similarly structured to the optical unit 10 of the first embodiment except a structure of the flexible wiring board 51 and forming positions of the connection part 50a and the positioning part 52.

A flexible wiring board 51 of an optical unit 10 in this embodiment is formed in a shape that the flexible wiring board 51 of the optical unit 10 in the first embodiment is inverted in the "Z"-axis direction. Further, both forming positions of a connection part 50a and a positioning part 52 in this embodiment are set to be an object side with respect to the forming positions of the connection part 50a and the positioning part 52 of the first embodiment. However, similarly to the optical unit 10 in the first embodiment, a position in the "Z"-axis direction of the turning axis 60 is located on an outer side with respect to a range "S" from the connection part 50a to the positioning part 52.

[Third Embodiment] ((c) of FIG. 6)

(c) of FIG. 6 is a schematic view showing an optical unit 10 in a third embodiment and is a view corresponding to (a) of FIG. 6 in the optical unit 10 of the first embodiment. Structure members common to the first embodiment are indicated with the same reference signs and their detailed descriptions are omitted. An optical unit 10 in this embodiment is similarly structured to the optical unit 10 of the first embodiment except a structure of the flexible wiring board 51 and forming positions of the connection part 50a and the positioning part 52.

In the optical unit 10 in this embodiment, the number of folding times of the flexible wiring board 51 is four times. Further, the flexible wiring board 51 in this embodiment is folded four times to an object side in an extended direction of the flexible wiring board 51 going from one end of the flexible wiring board 51 to the other end. However, similarly to the optical unit 10 in the first embodiment or the second embodiment, a position in the "Z"-axis direction of the turning axis 60 is located on an outer side with respect to a range "S" from the connection part 50a to the positioning part 52.

In the optical unit 10 in this embodiment, different from the optical units 10 in the first embodiment and the second embodiment, a position of the positioning part 52 in the optical axis direction is different from a position of the connection part 50a in the optical axis direction. According to this structure, a length of the flexible wiring board 51 can be easily increased without folding the flexible wiring board 51 to both sides of an object side and an opposite side to the object side. When a length of the flexible wiring board 51 is increased, responsiveness to displacement of the flexible wiring board 51 can be improved and a load applied to the flexible wiring board 51 can be effectively reduced.

[Fourth Embodiment] ((d) of FIG. 6)

(d) of FIG. 6 is a schematic view showing an optical unit 10 in a fourth embodiment and is a view corresponding to (a) of FIG. 6 in the optical unit 10 of the first embodiment. Structure members common to the first embodiment are indicated with the same reference signs and their detailed descriptions are omitted. An optical unit 10 in this embodiment is similarly structured to the optical unit 10 of the first embodiment except a structure of the flexible wiring board 51 and forming positions of the connection part 50a and the positioning part 52.

A flexible wiring board 51 of an optical unit 10 in this embodiment is formed in a shape that the flexible wiring board 51 of the optical unit 10 in the third embodiment is inverted in the "Z"-axis direction. Further, a forming position of the connection part 50a is located on an object side with respect to the forming position of the connection part 50a in the third embodiment, and a forming position of the positioning part 52 is located on an opposite side to the object side with respect to the forming position of the positioning part 52 in the third embodiment. However, similarly to the optical unit 10 in the first embodiment through the third embodiment, a position in the "Z"-axis direction of the turning axis 60 is located on an outer side with respect to a range "S" from the connection part 50a to the positioning part 52.

Figure 7:
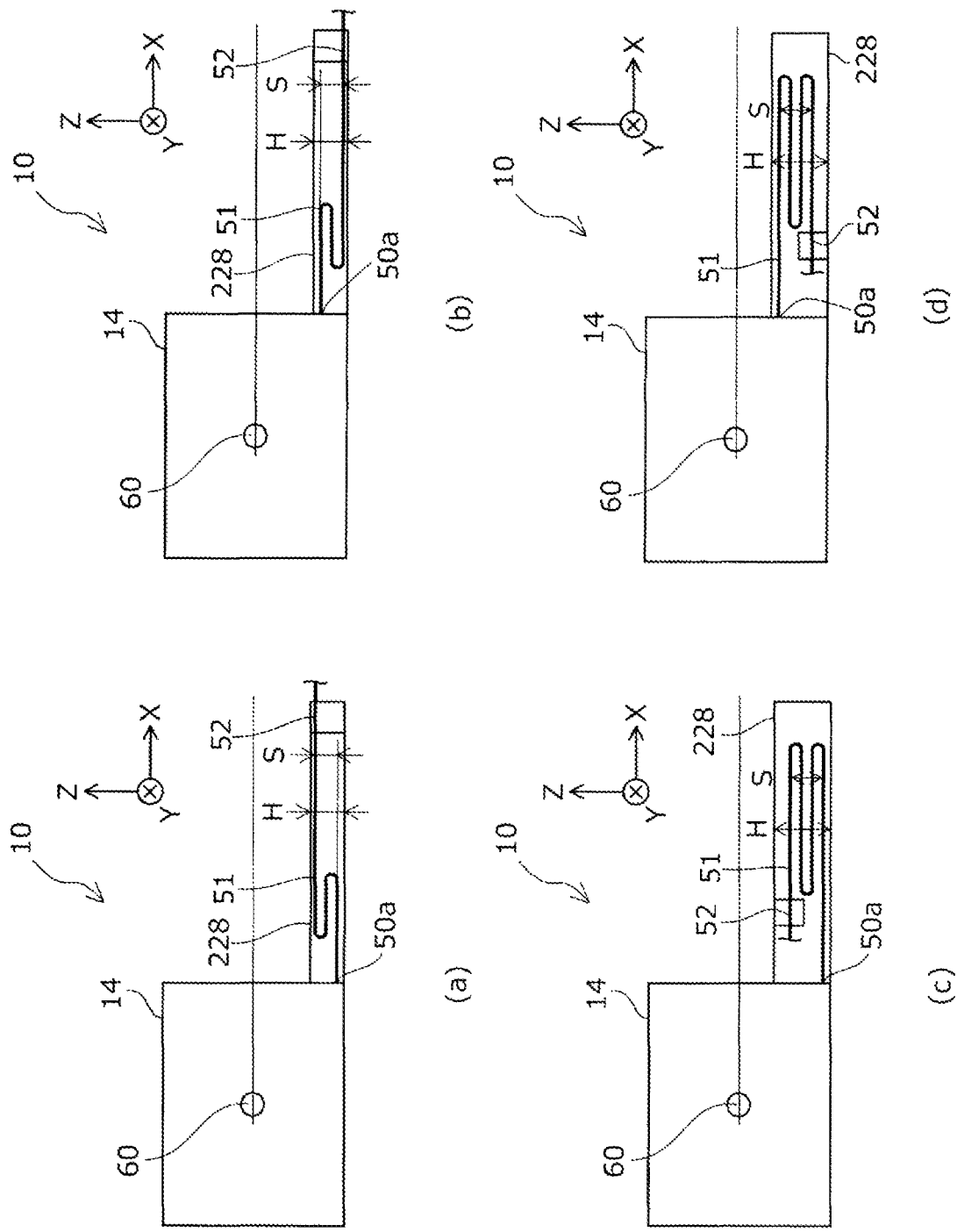
In FIG. 7, (a) through (d) are schematic views showing optical units in accordance with a fifth embodiment through an eighth embodiment of the present invention.

[Fifth Embodiment] ((a) of FIG. 7)

(a) of FIG. 7 is a schematic view showing an optical unit 10 in a fifth embodiment and is a view corresponding to (a) of FIG. 6 in the optical unit 10 of the first embodiment. Structure members common to the first embodiment are indicated with the same reference signs and their detailed descriptions are omitted. An optical unit 10 in this embodiment is similarly structured to the optical unit 10 of the first embodiment except a structure of the flexible wiring board 51 and forming positions of the connection part 50a and the positioning part 52.

In the optical unit 10 in this embodiment, the number of folding times of the flexible wiring board 51 is twice. Further, the flexible wiring board 51 in this embodiment is folded twice to an object side in an extended direction of the flexible wiring board 51 going from one end of the flexible wiring board 51 to the other end. However, similarly to the optical unit 10 in the first embodiment through the fourth embodiment, a position in the "Z"-axis direction of the turning axis 60 is located on an outer side with respect to a range "S" from the connection part 50a to the positioning part 52.

[Sixth Embodiment] ((b) of FIG. 7)

(b) of FIG. 7 is a schematic view showing an optical unit 10 in a sixth embodiment and is a view corresponding to (a) of FIG. 6 in the optical unit 10 of the first embodiment. Structure members common to the first embodiment are indicated with the same reference signs and their detailed descriptions are omitted. An optical unit 10 in this embodiment is similarly structured to the optical unit 10 of the first embodiment except a structure of the flexible wiring board 51 and forming positions of the connection part 50a and the positioning part 52.

A flexible wiring board 51 of an optical unit 10 in this embodiment is formed in a shape that the flexible wiring board 51 of the optical unit 10 in the fifth embodiment is inverted in the "Z"-axis direction. Further, a forming position of the connection part 50a is located on an object side with respect to the forming position of the connection part 50a in the fifth embodiment, and a forming position of the positioning part 52 is located on an opposite side to the object side with respect to the forming position of the positioning part 52 in the fifth embodiment. However, similarly to the optical unit 10 in the first embodiment through the fifth embodiment, a position in the "Z"-axis direction of the turning axis 60 is located on an outer side with respect to a range "S" from the connection part 50a to the positioning part 52.

[Seventh Embodiment] ((c) of FIG. 7)

(c) of FIG. 7 is a schematic view showing an optical unit 10 in a seventh embodiment and is a view corresponding to (a) of FIG. 6 in the optical unit 10 of the first embodiment. Structure members common to the first embodiment are indicated with the same reference signs and their detailed descriptions are omitted. An optical unit 10 in this embodiment is similarly structured to the optical unit 10 of the first embodiment except a structure of the flexible wiring board 51 and forming positions of the connection part 50a and the positioning part 52.

In the optical unit 10 in this embodiment, the number of folding times of the flexible wiring board 51 is three times. Further, the flexible wiring board 51 in this embodiment is folded three times to an object side in an extended direction of the flexible wiring board 51 going from one end of the flexible wiring board 51 to the other end. However, similarly to the optical unit 10 in the first embodiment through the sixth embodiment, a position in the "Z"-axis direction of the turning axis 60 is located on an outer side with respect to a range "S" from the connection part 50a to the positioning part 52.

[Eighth Embodiment] ((d) of FIG. 7)

(d) of FIG. 7 is a schematic view showing an optical unit 10 in an eighth embodiment and is a view corresponding to (a) of FIG. 6 in the optical unit 10 of the first embodiment. Structure members common to the first embodiment are indicated with the same reference signs and their detailed descriptions are omitted. An optical unit 10 in this embodiment is similarly structured to the optical unit 10 of the first embodiment except a structure of the flexible wiring board 51 and forming positions of the connection part 50a and the positioning part 52.

A flexible wiring board 51 of an optical unit 10 in this embodiment is formed in a shape that the flexible wiring board 51 of the optical unit 10 in the seventh embodiment is inverted in the "Z"-axis direction. Further, a forming position of the connection part 50a is located on an object side with respect to the forming position of the connection part 50a in the seventh embodiment, and a forming position of the positioning part 52 is located on an opposite side to the object side with respect to the forming position of the positioning part 52 in the seventh embodiment. However, similarly to the optical unit 10 in the first embodiment through the seventh embodiment, a position in the "Z"-axis direction of the turning axis 60 is located on an outer side with respect to a range "S" from the connection part 50a to the positioning part 52.

As shown in the optical units 10 of the first embodiment through the eighth embodiment, the number of folding times of the flexible wiring board 51 is not especially limited. However, when the number of folding times of the flexible wiring board 51 is reduced, man-hours when the flexible wiring board 51 is to be formed can be restrained from excessively increasing. On the other hand, when the number of folding times of the flexible wiring board 51 is increased, a load applied to the flexible wiring board 51 may be effectively reduced. Therefore, it is preferable that the number of folding times of the flexible wiring board 51 is determined in accordance with an application of the optical unit 10.

Figure 8:
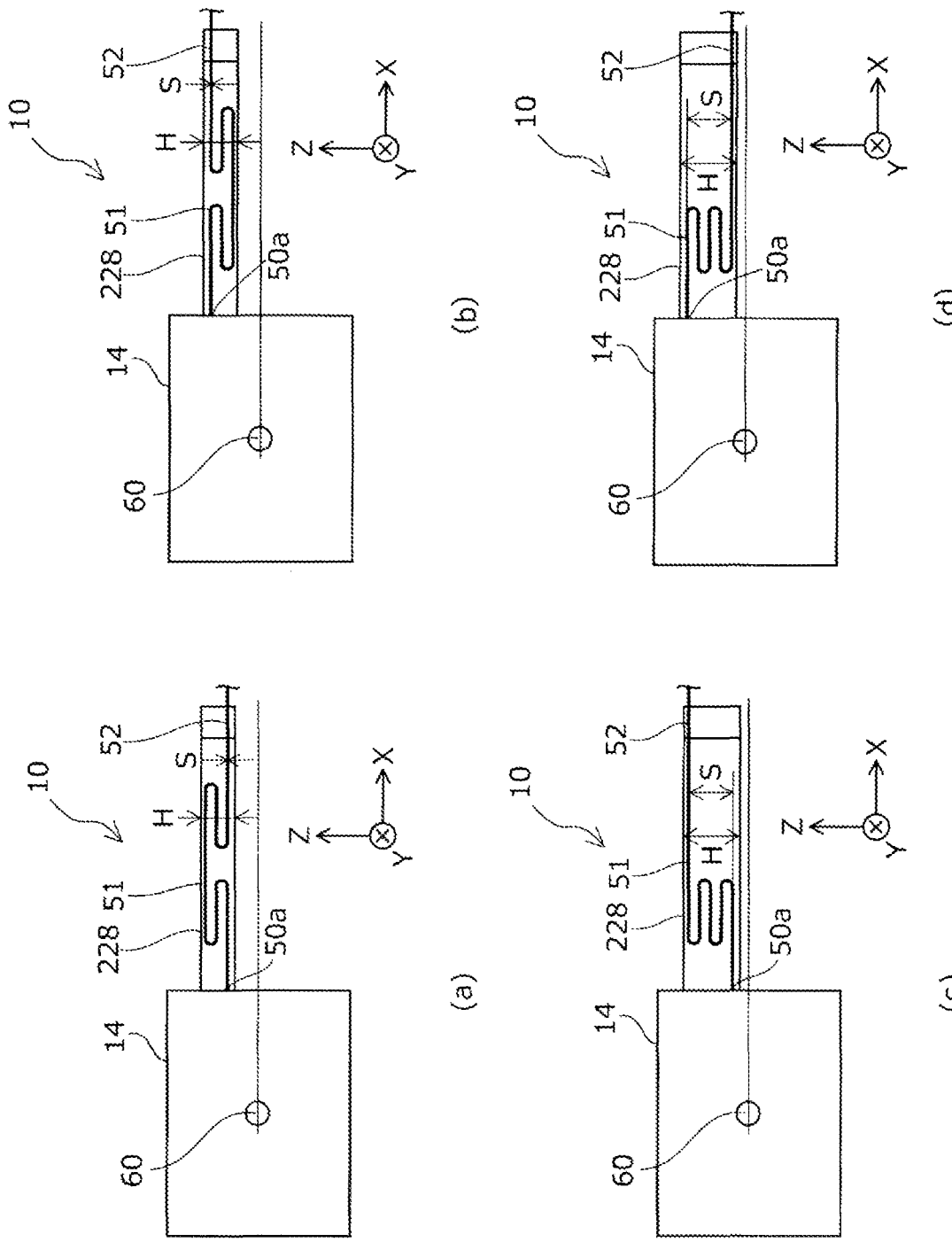
In FIG. 8, (a) through (d) are schematic views showing optical units in accordance with a ninth embodiment through a twelfth embodiment of the present invention.
Figure 9:
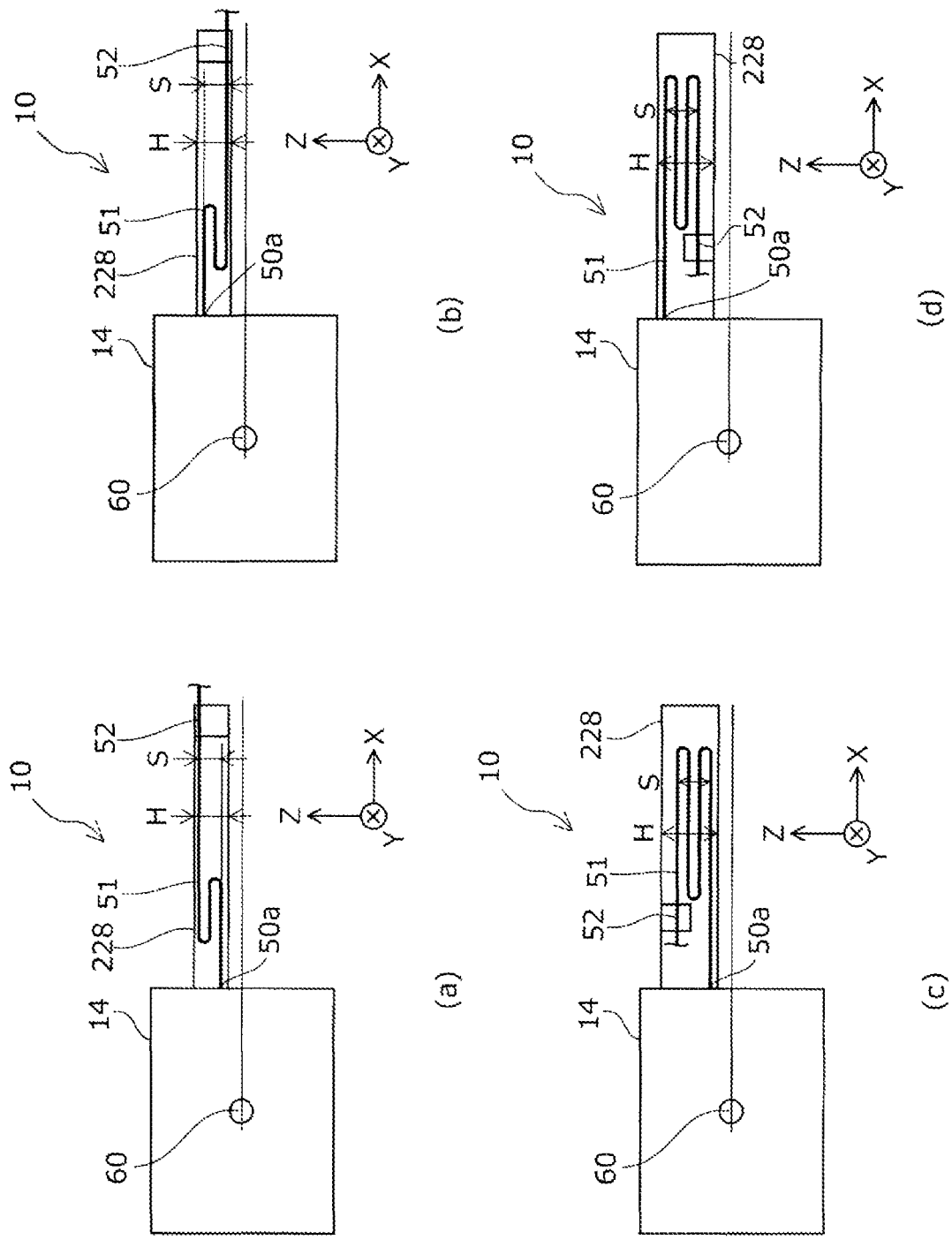
In FIG. 9, (a) through (d) are schematic views showing optical units in accordance with a thirteenth embodiment through a sixteenth embodiment of the present invention.

[Ninth Embodiment Through Sixteenth Embodiment] ((a) Through (d) of FIG. 8, and (a) Through (d) of FIG. 9)

Each of the optical units 10 of the first embodiment through the eighth embodiment is an example that the position in the "Z"-axis direction of the turning axis 60 is located on an object side with respect to the positions of the connection part 50a and the positioning part 52. However, as shown in (a) through (d) of FIG. 8 and (a) through (d) of FIG. 9, the position in the "Z"-axis direction of the turning axis 60 may be located on an opposite side to an object side with respect to the positions of the connection part 50a and the positioning part 52. Each of (a) of FIG. 8, (b) of FIG. 8, (c) of FIG. 8, (d) of FIG. 8, (a) of FIG. 9, (b) of FIG. 9, (c) of FIG. 9 and (d) of FIG. 9 is a view corresponding to (a) of FIG. 6 in the optical unit 10 of the first embodiment. In this case, structure members common to the first embodiment through the eighth embodiment are indicated with the same reference signs and their detailed descriptions are omitted.

(a) of FIG. 8 shows an optical unit 10 in a ninth embodiment which includes a flexible wiring board 51 similar to that of the optical unit 10 in the first embodiment and in which a position in the "Z"-axis direction of the turning axis 60 is located on an opposite side to an object side with respect to the positions of the connection part 50a and the positioning part 52. Further, (b) of FIG. 8 shows an optical unit 10 in a tenth embodiment which includes a flexible wiring board 51 similar to that of the optical unit 10 in the second embodiment and in which a position in the "Z"-axis direction of the turning axis 60 is located on an opposite side to an object side with respect to the positions of the connection part 50a and the positioning part 52. Further, (c) of FIG. 8 shows an optical unit 10 in an eleventh embodiment which includes a flexible wiring board 51 similar to that of the optical unit 10 in the third embodiment and in which a position in the "Z"-axis direction of the turning axis 60 is located on an opposite side to an object side with respect to the positions of the connection part 50a and the positioning part 52. Further, (d) of FIG. 8 shows an optical unit 10 in a twelfth embodiment which includes a flexible wiring board 51 similar to that of the optical unit 10 in the fourth embodiment and in which a position in the "Z"-axis direction of the turning axis 60 is located on an opposite side to an object side with respect to the positions of the connection part 50a and the positioning part 52.

Further, (a) of FIG. 9 shows an optical unit 10 in a thirteenth embodiment which includes a flexible wiring board 51 similar to that of the optical unit 10 in the fifth embodiment and in which a position in the "Z"-axis direction of the turning axis 60 is located on an opposite side to an object side with respect to the positions of the connection part 50a and the positioning part 52. Further, (b) of FIG. 9 shows an optical unit 10 in a fourteenth embodiment which includes a flexible wiring board 51 similar to that of the optical unit 10 in the sixth embodiment and in which a position in the "Z"-axis direction of the turning axis 60 is located on an opposite side to an object side with respect to the positions of the connection part 50a and the positioning part 52. Further, (c) of FIG. 9 shows an optical unit 10 in a fifteenth embodiment which includes a flexible wiring board 51 similar to that of the optical unit 10 in the seventh embodiment and in which a position in the "Z"-axis direction of the turning axis 60 is located on an opposite side to an object side with respect to the positions of the connection part 50a and the positioning part 52. Further, (d) of FIG. 9 shows an optical unit 10 in a sixteenth embodiment which includes a flexible wiring board 51 similar to that of the optical unit 10 in the eighth embodiment and in which a position in the "Z"-axis direction of the turning axis 60 is located on an opposite side to an object side with respect to the positions of the connection part 50a and the positioning part 52.

Figure 10:
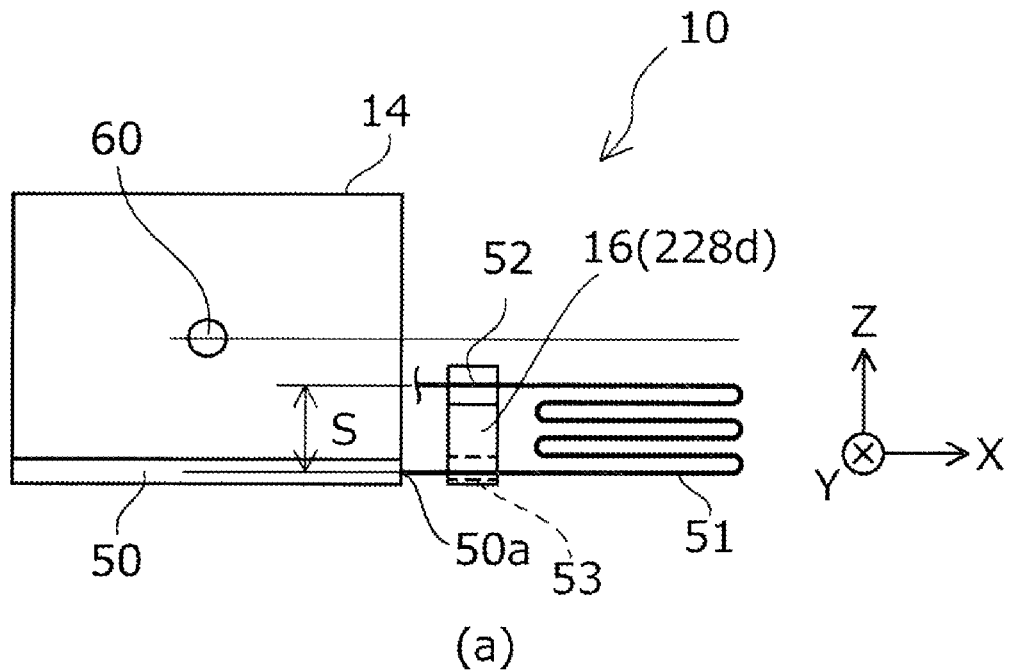
In FIG. 10, (a) and (b) are schematic views showing optical units in accordance with a seventeenth embodiment and an eighteenth embodiment of the present invention.
Figure 10:
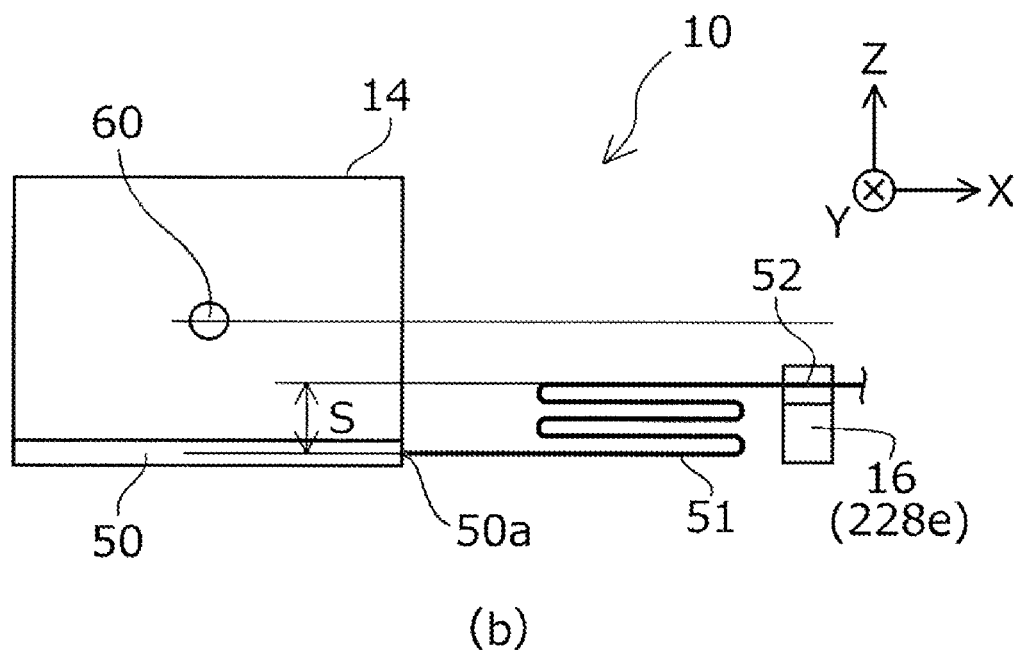

[Seventeenth Embodiment] ((a) of FIG. 10)]

(a) of FIG. 10 is a schematic view showing an optical unit 10 in a seventeenth embodiment and is a view corresponding to (a) of FIG. 6 in the optical unit 10 of the first embodiment. Structure members common to the first embodiment through the sixteenth embodiment are indicated with the same reference signs and their detailed descriptions are omitted. An optical unit 10 in this embodiment is similarly structured to the optical unit 10 of the first embodiment except a shape of the fixed body 16, a structure of the flexible wiring board 51 and a forming position of the positioning part 52.

In the optical unit 10 in this embodiment, the number of folding times of the flexible wiring board 51 is five times. Further, the optical unit 10 is structured so that the fixed body 16 is provided with a wall part 228d on the first intersecting direction side with respect to the movable body 14, and a positioning part 52 is formed in the wall part 228d, and a flexible wiring board 51 is passed through a space part 53 provided in the wall part 228d. In this embodiment, similarly to the optical unit 10 of the first embodiment, a position in the "Z"-axis direction of a turning axis 60 of the movable body 14 with respect to the fixed body 16 in the axial direction of pitching along the "Y"-axis direction is located on an outer side with respect to a range "S" from the connection part 50a to the positioning part 52.

[Eighteenth Embodiment] ((b) of FIG. 10)

(b) of FIG. 10 is a schematic view showing an optical unit 10 in an eighteenth embodiment and is a view corresponding to (a) of FIG. 6 in the optical unit 10 of the first embodiment. Structure members common to the first embodiment through the seventeenth embodiment are indicated with the same reference signs and their detailed descriptions are omitted. An optical unit 10 in this embodiment is similarly structured to the optical unit 10 of the first embodiment except a shape of the fixed body 16, a structure of the flexible wiring board 51 and a forming position of the positioning part 52.

In the optical unit 10 in this embodiment, the number of folding times of the flexible wiring board 51 is four times. Further, the fixed body 16 is provided with a wall part 228e on the first intersecting direction side with respect to the movable body 14, and a positioning part 52 is formed in the wall part 228e. In this embodiment, similarly to the optical unit 10 of the first embodiment, a position in the "Z"-axis direction of a turning axis 60 of the movable body 14 with respect to the fixed body 16 in the axial direction of pitching along the "Y"-axis direction is located on an outer side with respect to a range "S" from the connection part 50a to the positioning part 52.

As described in the optical units 10 in the embodiments described above, it is preferable that the fixed body 16 is not provided with a wall part intersecting the first intersecting direction between the connection part 50a and the positioning part 52 on the first intersecting direction side. As it is clear from a comparison with the optical unit 10 in the seventeenth embodiment, the flexible wiring board 51 extended from the connection part 50a to the positioning part 52 can be restrained from interfering with the fixed body 16 (for example, with an inner wall of the space part 53 formed in a wall part).

The present invention is not limited to the above-mentioned embodiments and can be realized in various structures in a range not apart from the objective. For example, technical features in the above-mentioned specific embodiments corresponding to the technical features in the respective embodiments described in the summary of the invention may be appropriately substituted and combined in order to solve a part or all of the above-mentioned objective or, in order to achieve a part or all of the above-mentioned effects. Further, in a case that the technical feature is not described to be essential in the present specification, the technical feature may be appropriately deleted.

Further, the imaging element 50 may be disposed on the first intersecting direction side of the optical unit 10 in the above-mentioned embodiments, for example, on the first intersecting direction side with the turning axis 60 as a reference. In this case, the expression of that "on the first intersecting direction side with the turning axis 60 as a reference" means that a center in the "X"-axis direction of the imaging element 50 is located on the first intersecting direction side with respect to the turning axis 60. According to this arrangement, a length of the flexible wiring board 51 can be reduced in an inside of the fixed body 16 and a size of the fixed body 16 can be reduced and, as a result, a size of the optical unit 10 can be reduced.

Further, the optical units 10 in the first embodiment through the eighteenth embodiment are optical units structured to include the gimbal mechanism 21 as a mechanism for moving the movable body 14 with respect to the fixed body 16. However, the present invention is not limited to such a structure and, for example, the optical unit 10 may include a pivot mechanism instead of the gimbal mechanism 21.

The invention claimed is:

1. An optical unit comprising:
a movable body comprising an optical module;
a fixed body;
a support mechanism which turnably supports the movable body with respect to the fixed body with one or a plurality of directions intersecting an optical axis direction as a direction of a turning axis;
a flexible wiring board whose one end is connected with a connection part provided in the movable body and which is disposed on a side in a first intersecting direction intersecting the optical axis direction with respect to the movable body; and
a positioning part which is disposed on the side in the first intersecting direction with respect to the movable body and positions an other end of the flexible wiring board in the optical axis direction;
wherein the flexible wiring board is folded so as to be overlapped with each other in a state that the flexible wiring board is viewed in the optical axis direction;
wherein a position of the connection part in the optical axis direction and a position of the positioning part in the optical axis direction are located within a dimensional range of the movable body in the optical axis direction;
wherein a position of the turning axis in the optical axis direction is located at a position on an outer side with respect to a range from the connection part to the positioning part; and
wherein the positioning part is integrally formed with the fixed body and allows movement in the first intersecting direction of the flexible wiring board.

2. The optical unit according to claim 1, wherein
a folding direction of the flexible wiring board in an extended direction from the one end toward the other end in a state that the flexible wiring board is viewed in the first intersecting direction includes: at least a folding direction to a side of the turning axis in the optical axis direction.

3. The optical unit according to claim 2, wherein
a number of folding times of the flexible wiring board is a plurality of times, and
the folding direction of the flexible wiring board in the extended direction in a state that the flexible wiring board is viewed in the first intersecting direction includes: both the side of the turning axis in the optical axis direction and an opposite side to the side of the turning axis in the optical axis direction.

4. The optical unit according to claim 3, wherein
the number of folding times of the flexible wiring board is set, so that a number of folding times to the side of the turning axis in the optical axis direction and a number of folding times to the opposite side to the side of the turning axis side in the optical axis direction are same as each other.

5. The optical unit according to claim 4, wherein
the flexible wiring board is symmetrically folded with a center part in the first intersecting direction of respective folded portions of the flexible wiring board as a reference in a state that the flexible wiring board is viewed in a direction intersecting both the optical axis direction and the first intersecting direction.

6. The optical unit according to claim 1, wherein
a number of folding times of the flexible wiring board is an even number of times.

7. The optical unit according to claim 1, wherein
a position of the positioning part in the optical axis direction is different from a position of the connection part in the optical axis direction.

8. The optical unit according to claim 1, wherein
the flexible wiring board comprises a branch region in which the flexible wiring board is branched in an extended direction going from the one end toward the other end.

9. The optical unit according to claim 8, wherein
the branch region viewed in the extended direction is provided so that the flexible wiring board is symmetrical.

10. The optical unit according to claim 1, further comprising:
a cover which covers at least a part of the flexible wiring board.

11. The optical unit according to claim 1, wherein
a folded portion of the flexible wiring board comprises a folding hold part which holds the folded portion.

12. The optical unit according to claim 1, further comprising:
a turning drive mechanism structured to turn the movable body with respect to the fixed body,
wherein the turning drive mechanism is disposed at a position other than the side in the first intersecting direction with respect to the movable body.

13. The optical unit according to claim 1, wherein
the optical module comprises an imaging element, and
the imaging element is disposed on the side in the first intersecting direction with the turning axis as a reference.

* * * * *